United States Patent
Lee et al.

(10) Patent No.: US 7,714,403 B2
(45) Date of Patent: May 11, 2010

(54) IMAGE SENSOR USING BACK-ILLUMINATED PHOTODIODE AND METHOD OF MANUFACTURING THE SAME

(75) Inventors: Byoung Su Lee, Yeosu-si (KR); Jun Ho Won, Seoul (KR)

(73) Assignee: Siliconfile Technologies Inc. (KR)

( * ) Notice: Subject to any disclaimer, the term of this patent is extended or adjusted under 35 U.S.C. 154(b) by 0 days.

(21) Appl. No.: 12/305,511

(22) PCT Filed: Jun. 14, 2007

(86) PCT No.: PCT/KR2007/002876

§ 371 (c)(1),
(2), (4) Date: Dec. 18, 2008

(87) PCT Pub. No.: WO2007/148891

PCT Pub. Date: Dec. 27, 2007

(65) Prior Publication Data

US 2009/0224345 A1    Sep. 10, 2009

(30) Foreign Application Priority Data

Jun. 19, 2006  (KR) .................. 10-2006-0054767

(51) Int. Cl.
*H01L 31/0232* (2006.01)
*H01L 31/102* (2006.01)

(52) U.S. Cl. .................. 257/432; 257/444; 257/448; 257/457; 257/460; 257/E23.127; 438/70; 438/72; 438/455; 438/458; 438/459

(58) Field of Classification Search .......... 438/70, 438/72, 459; 257/432, 444, 448, 457, E31.127

See application file for complete search history.

(56) References Cited

U.S. PATENT DOCUMENTS

| 6,184,055 | B1 |  | 2/2001 | Yang et al. |
| 6,476,374 | B1 | * | 11/2002 | Kozlowski et al. ........ 250/214.1 |
| 6,891,242 | B2 | * | 5/2005 | Gidon et al. ................. 257/443 |
| 7,101,726 | B2 | * | 9/2006 | Yamamoto et al. ............ 438/69 |
| 7,598,583 | B2 | * | 10/2009 | Han ............................. 257/444 |
| 2006/0197007 | A1 | * | 9/2006 | Iwabuchi et al. ......... 250/208.1 |

FOREIGN PATENT DOCUMENTS

JP   2005-150463   6/2005
KR   10-2006-0048661   5/2006

OTHER PUBLICATIONS

International Search Report-PCT/KR2007/002876 dated Oct. 5, 2007.
Written Opinion-PCT/KR2007/002876 dated Oct. 5, 2007.

* cited by examiner

*Primary Examiner*—Charles D Garber
*Assistant Examiner*—Angel Roman
(74) *Attorney, Agent, or Firm*—Jae Y. Park; Kile Goekjian Reed & McManus

(57) ABSTRACT

An image sensor using a back-illuminated photodiode and a manufacturing method thereof are provided. According to the present invention, since a surface of the back-illuminated photodiode can be stably treated, the back-illuminated photodiode can be formed to have a low dark current, a constant sensitivity of blue light for all photodiodes, and high sensitivity. In addition, it is possible to manufacture an image sensor with high density by employing a three dimensional structure in which a photodiode and a logic circuit are separately formed on different substrates.

7 Claims, 5 Drawing Sheets

IMAGE SENSOR USING
BACK-ILLUMINATED PHOTODIODE AND
METHOD OF MANUFACTURING THE SAME

BACKGROUND OF THE INVENTION

1. Field of the Invention

The present invention relates to an image sensor, and more particularly, to an image sensor using a back-illuminated photodiode which absorbs light through its bottom side and a method of manufacturing the image sensor.

2. Description of the Related Art

A complementary metal-oxide semiconductor (CMOS) image sensor is a device for measuring light intensity. In general, such image sensor has a structure in which a photodiode is formed on a plane where a digital/analog circuit is formed, and a metal wire and an inter-metal dielectric (IMD) layer are formed on a top side of the photodiode.

In the conventional image sensor, light passes through a micro-lens and a color filter and thereafter proceeds along a pathway of several films before being absorbed by the photodiode. Throughout this process, sensitivity of light, particularly, blue light, deteriorates.

Furthermore, in the conventional image sensor, after passing through green, red, and blue color filters, light is reflected by a multi-layered metal wire. This affects an adjacent photodiode, resulting in a color crosstalk. Also, an electrical crosstalk occurs in a bottom side of the photodiode due to red light having a long wavelength.

In the image sensor using the back-illuminated photodiode, instead of passing through the IMD layer laminated on the top side of the photodiode, light is directly absorbed by a silicon substrate on which the photodiode is formed. Thus, sensitivity of light is significantly improved.

In order to employ a structure of the back-illuminated photodiode, there is a need to remove noise caused by a surface defect, for example, a dangling bond existing on a surface of an epitaxial layer with low concentration. However, there has been a problem in that heat treatment cannot be performed at a high-temperature because of the existing metal wire.

Therefore, the conventional image sensor using the back-illuminated photodiode cannot solve a noise problem that is resulted from a defected surface of a silicon substrate on which the back-illuminated photodiode is formed.

To address this problem, laser scanning is generally used for instantaneous high-temperature heat treatment, which is disadvantageously expensive and time consuming.

SUMMARY OF THE INVENTION

The present invention provides an image sensor using a back-illuminated photodiode which absorbs light through its bottom side instead of its top side, restricts the generation of noise and crosstalk by treating a wafer surface, and thus improves sensitivity, and a method of manufacturing the image sensor.

According to an aspect of the present invention, there is provided an image sensor using a back-illuminated photodiode, comprising: an epitaxial layer (hereinafter, referred to as epi-layer) formed on a specific type of wafer by doping impurities with low concentration; a potential barrier formed on a surface of the epi-layer; a back-illuminated photodiode formed on the epi-layer formed on a back side of the first wafer; a logic circuit formed on a specific region of the wafer so as to be electrically connected to the back-illuminated photodiode by the use of a metal wire; a pad formed on the potential barrier and electrically connected to an external circuit of the image sensor; and a via formed through the epi-layer and a plug which fills the via so that the pad is electrically connected to the logic circuit.

According to another aspect of the present invention, there is provided an image sensor using a back-illuminated photodiode, comprising: epi-layers formed on first and second wafers each having a specific type by doping impurities with low concentration; a potential barrier formed on a surface of the epi-layer of the first wafer; a back-illuminated photodiode formed on the epi-layer which is formed on a back side of the first wafer; the second wafer on which a logic circuit is formed; a metal bonding portion by which a metal wire connected to the back-illuminated photodiode formed on the first wafer is electrically connected to a metal wire connected to the logic circuit formed on the second wafer; a pad formed on the potential barrier of the first wafer and electrically connected to an external circuit of the image sensor; and a via formed through the epi-layer and a plug which fills the via so that the pad is electrically connected to the logic circuit of the second wafer.

According to another aspect of the present invention, there is provided a method of manufacturing an image sensor, comprising the steps of: (a) forming an epi-layer with low concentration on a specific type of wafer, and forming a potential barrier on a surface of the epi-layer; (b) removing a back side of the wafer except for the epi-layer; (c) forming a back-illuminated photodiode and a logic circuit on the surface of the epi-layer exposed in (b); (d) forming an inter-metal dielectric (IMD) layer on the back-illuminated photodiode, and forming a metal wire inside the IMD layer to electrically connect the back-illuminated photodiode and the logic circuit; (e) forming a passivation layer, a color filter, and a micro-lens on a surface of the potential barrier; (f) forming a via connected to the logic circuit through the epi-layer from the surface of the potential barrier, and filling a plug into the via; and (g) forming a pad on a surface of the via filled with the plug.

According to another aspect of the present invention, there is provided a method of manufacturing an image sensor, comprising the steps of: (a) forming epi-layers with low concentration on first and second wafers each having a specific type, and forming a potential barrier on a surface of the epi-layer of the first wafer; (b) removing a back side of the first wafer except for the epi-layer; (c) forming a back-illuminated photodiode on the surface of the epi-layer exposed in (b); (d) forming an inter-metal dielectric (IMD) layer on the back-illuminated photodiode, and forming a metal wire inside the IMD layer; (e) forming a via connected to the metal wire through the epi-layer from a surface of the potential barrier, and filling a plug into the via; (f) forming an IMD layer on the epi-layer formed on the second wafer, and forming a logic circuit including a metal wire inside the IMD layer; (g) connecting a metal wire of the first wafer to a metal wire of the logic circuit of the second wafer by using metal bonding; (h) forming a passivation layer, a color filter, and a micro-lens on a surface of the potential barrier; and (i) forming a pad on a surface of the via filled with the plug of the first wafer.

DETAILED DESCRIPTION OF THE INVENTION

Hereinafter, exemplary embodiments of the present invention will be described in detail with reference to the accompanying drawings.

Figure 1:
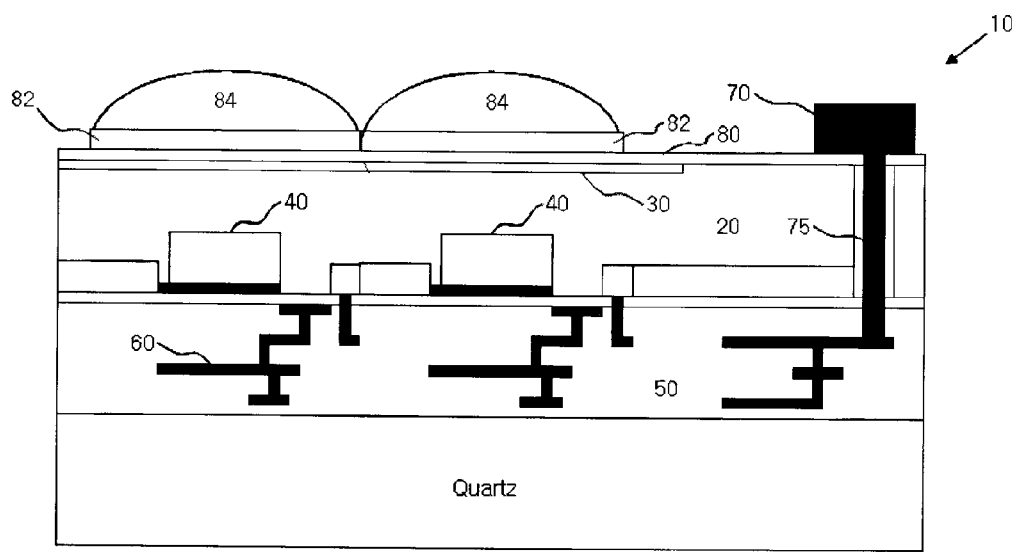
FIG. 1 is a cross-sectional view of a structure of an image sensor using a back-illuminated photodiode according to an embodiment of the present invention.

FIG. 1 is a cross-sectional view of a structure of an image sensor using a back-illuminated photodiode according to an embodiment of the present invention. The image sensor is formed of a specific type of wafer 10, an epitaxial layer (or epi-layer) 20, a potential barrier 30, a back-illuminated photodiode 40, an inter-metal dielectric (IMD) layer 50, a metal wire 60, a pad 70, a via & plug 75, a passivation layer 80, a color filter 82, and a micro-lens 84.

The potential barrier 30 is formed on a surface of the epi-layer 20 with low concentration by doping impurities having the same type as the epi-layer 20 and having higher concentration than the epi-layer 20.

The potential barrier 30 may be formed by using ion implantation, epitaxial growth, or boro silicate glass (BSG) deposition.

The back-illuminated photodiode 40 is formed on the epi-layer 20 that is formed on a back side of the wafer 10, that is, a back side of the potential barrier 30.

The IMD layer 50 is formed below the back-illuminated photodiode 40, that is, in a direction opposite to a portion where the potential barrier 30 is formed.

The metal wire 60 is formed in the IMD layer 50 so that the back-illuminated photodiode 40 is electrically connected to a logic circuit (not shown) formed on a specific region of the wafer 10.

The pad 70 is electrically connected to an external circuit and is formed above the potential barrier 30. The via 75 is formed to be connected to the metal wire 60 of the logic circuit (not shown) through the epi-layer 20, and thus the pad 70 is connected to the logic circuit (not shown). The plug is filled in the via 75.

As a protection layer, the passivation layer 80 is formed on the potential barrier 30. A plurality of color filters 82 are formed on the passivation layer 80. The micro-lens 84 is formed on the color filters 82.

Figure 2:
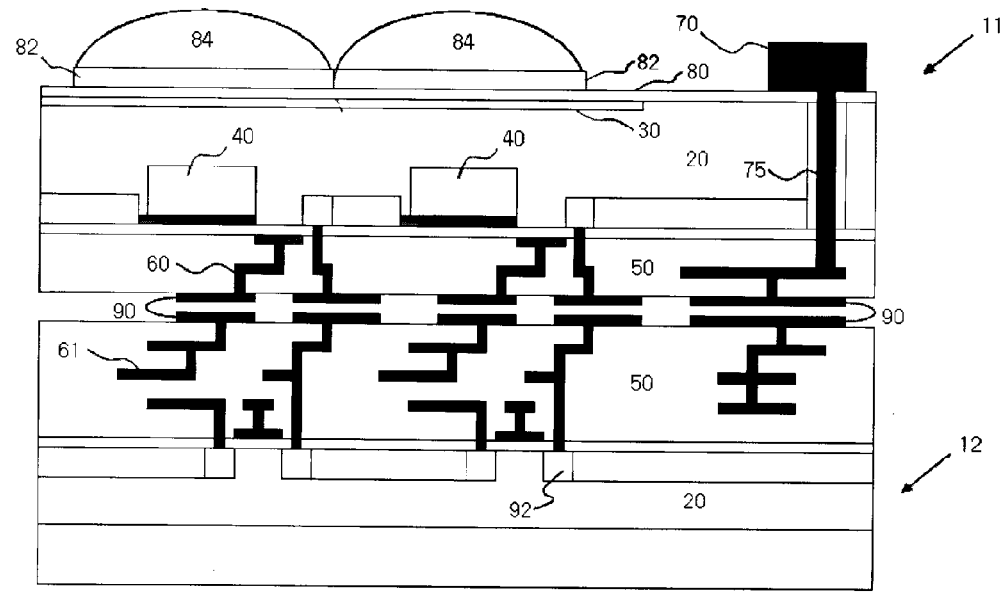
FIG. 2 is a cross-sectional view of a structure of an image sensor using a back-illuminated photodiode according to another embodiment of the present invention.

FIG. 2 is a cross-sectional view of a structure of an image sensor using a back-illuminated photodiode according to another embodiment of the present invention. A back-illuminated photodiode 40 and a logic circuit (not shown) are separately formed on first and second wafers 11 and 12. Then, the wafers 11 and 12 are bonded with each other by the use of a metal bonding pad 90.

Referring to FIG. 2, the first wafer 11 is formed of an epi-layer 20, a potential barrier 30, a back-illuminated photodiode 40, an IMD layer 50, a metal wire 60, a pad 70, a via & plug 75, a passivation layer 80, a color filter 82, a micro-lens 84, and a bonding pad 90. Further, the second wafer 12 is formed of an epi-layer 20, an IMD layer 50, a metal wire 61, transistors 92 on a logic region, and a metal bonding pad 90.

The metal wires 60 and 61 are respectively formed on the first and second wafers 11 and 12 and are electrically connected with each other by metal bonding.

In FIG. 2, the metal wire 60 connected to the back-illuminated photodiode 40 of the first wafer 11 is electrically connected to the metal wire 61 connected to the logic circuit (not shown) including the transistors 92 on the logic region of the second wafer 12 by the use of the metal bonding pad 90.

Unlike the image sensor of FIG. 1, the image sensor of FIG. 2 can be formed to have high density since the logic circuit (not shown) and the back-illuminated photodiode 40 are formed on the different wafers 11 and 12.

Figure 3:
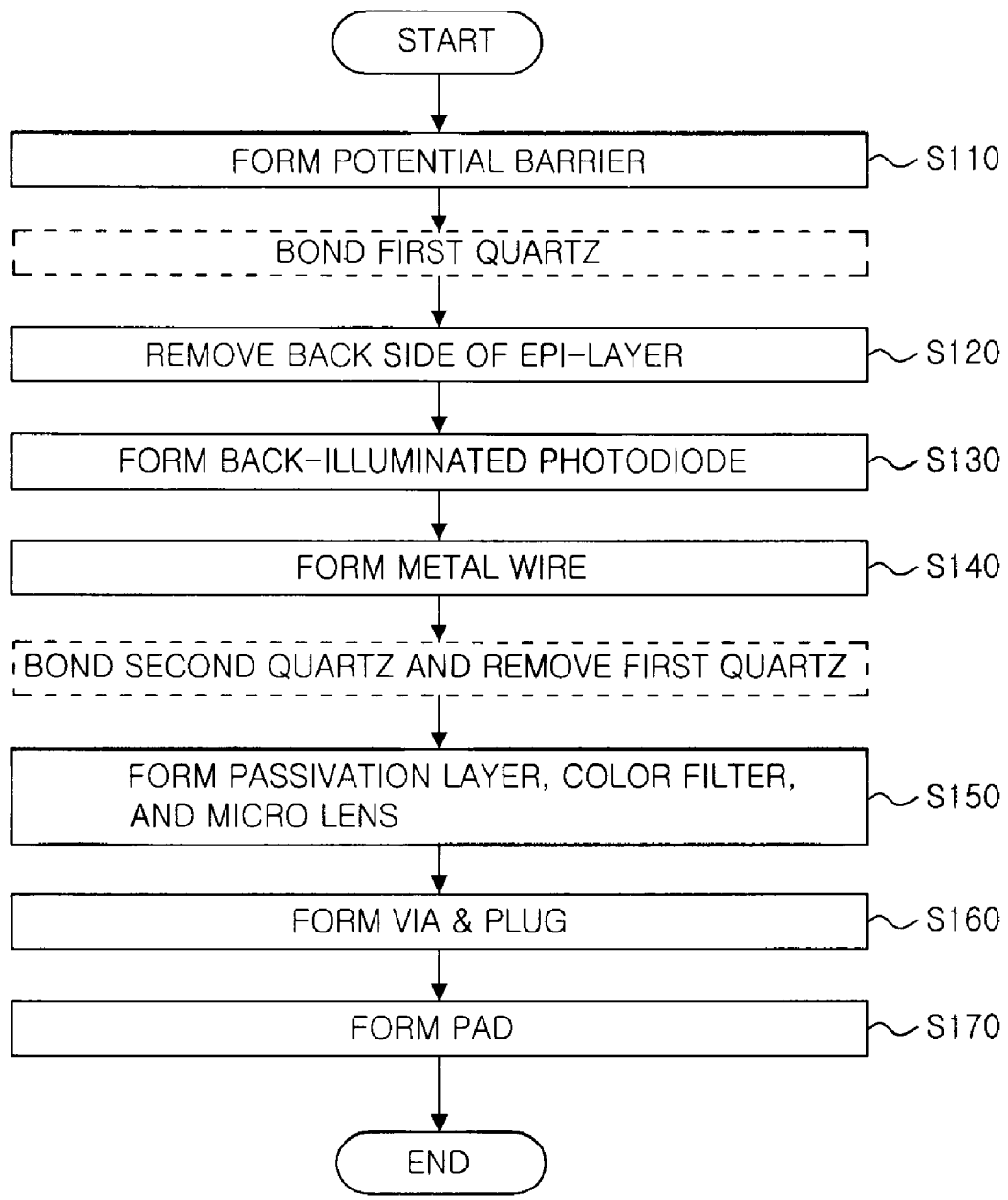
FIG. 3 is a flowchart of a method of manufacturing an image sensor using a back-illuminated photodiode according to an embodiment of the present invention.

FIG. 3 is a flowchart of a method of manufacturing an image sensor using a back-illuminated photodiode according to an embodiment of the present invention. The method includes the steps of: forming a potential barrier (step 110); removing a back side (step S120); forming a back-illuminated photodiode (step S130); forming a metal wire (step S140); forming a color filter (step S150); forming a via & plug (step S160); and forming a pad (step S170).

In step 110, an epi-layer is formed on a specific type of wafer by doping impurities with low concentration, and a potential barrier is then formed on a surface of the epi-layer.

The potential barrier may be formed using at least one method selected from a group consisting of ion implantation, epi-growth, and BSG deposition. In order to stabilize the surface of the epi-layer on which the potential barrier is formed, heat treatment may be performed at a specific temperature.

In step S120, the back side of the wafer is removed except for the epi-layer. Only the epi-layer remains on the wafer after this process is performed.

In some cases, a semiconductor substrate, that is, a wafer, may become too thin after its back side is removed in step S120, and thus a subsequent process cannot be performed. To ensure a thickness sufficient to perform the subsequent process, a first quartz may be bonded to the surface of the epi-layer before or after the back side is removed.

In step S130, a back-illuminated photodiode is formed on the exposed surface of the epi-layer by using a typical image sensor manufacturing process. A logic circuit is also formed in this step.

In step S140, an IMD layer is formed on the epi-layer surface where the back-illuminated photodiode is formed. Further, a metal wire is formed so that the back-illuminated photodiode formed inside the IMD layer is electrically connected to the logic circuit.

In step S150, a passivation layer, a color filter, and a micro-lens are formed on a surface of the potential barrier formed in step S110.

A second quartz may be bonded to the IMD layer in the presence of the first quartz, and the color filter or the like may be formed after removing the first quartz.

In step S160, a via is formed to be connected to the logic circuit. The via is formed through the epi-layer from the surface of the potential barrier after step S150, and a plug is filled in the via.

In step S170, a pad is formed on a surface of the via filled with the plug, and thus the via is electrically connected to an external circuit through the pad.

Figure 4:
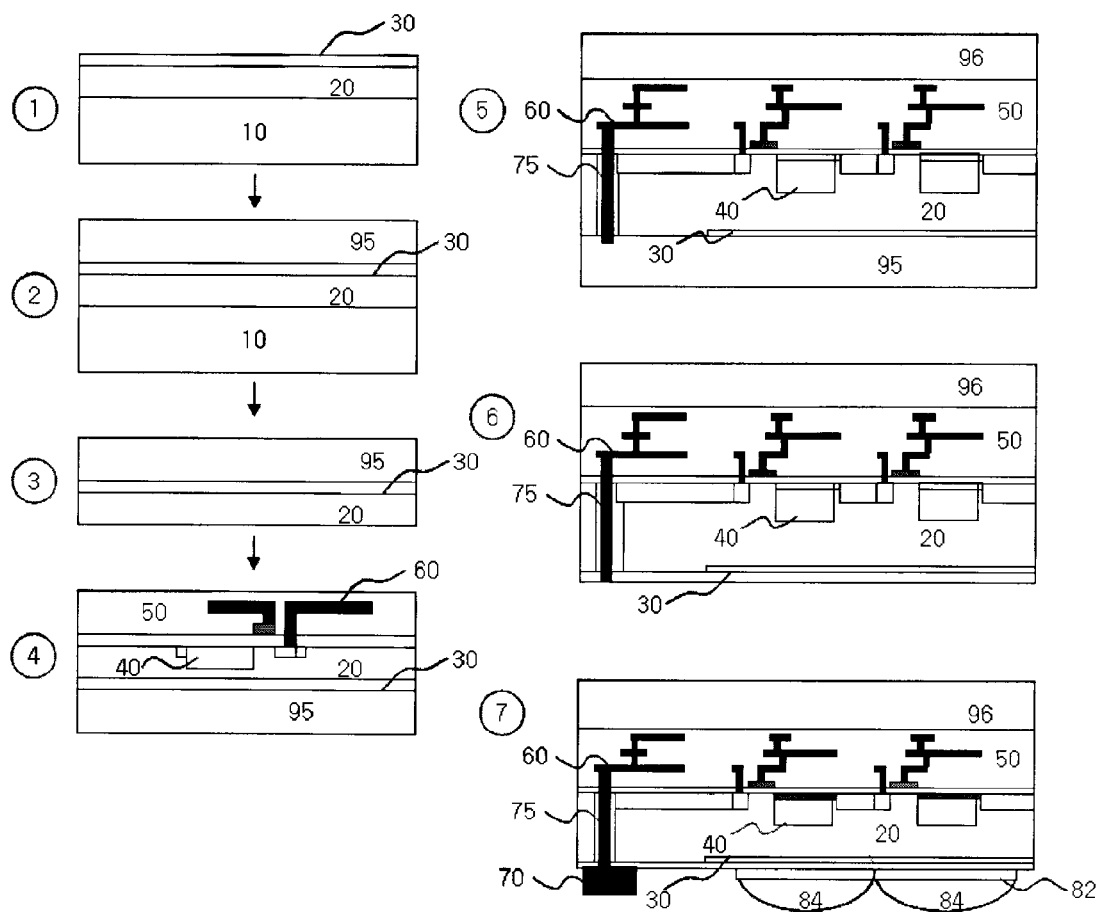
FIG. 4 illustrates cross-sectional views for explaining major processes of FIG. 3.

FIG. 4 illustrates cross-sectional views for explaining of major processes of FIG. 3. A manufacturing process of the image sensor of FIG. 1 will now be described with reference to FIG. 4.

In step 1, as shown in the first figure, a potential barrier 30 is formed over an entire surface of an epi-layer 20 with low concentration by doping impurities having the same type as the epi-layer 20 by using ion implantation or the like. Then, the surface of the epi-layer 20 is stabilized by using heat treatment or the like.

In step 2, as shown in the second figure, a first quartz 95 is bonded to the epi-layer 20. In step 3, as shown in the third figure, a wafer 10 is polished or etched to obtain a desired thickness of the epi-layer 20.

After steps 1 to 3 are completed, in step 4, the wafer 10 is turned over. Then, by using a typical image sensor manufacturing process, a logic circuit including a metal wire 60 and a back-illuminated photodiode 40 are formed on the remaining portion of the epi-layer 20 after etching.

Thereafter, in order to form a pad 70 through a back side, in step 5, a via & plug 75 is formed to pass through the epi-layer 20, and thus the metal wire 60 can be connected to the back side.

Thereafter, a second quartz 96 is bonded to an IMD layer 50 where the logic circuit is formed. In step 6, the first quartz 95 on the back side is removed by etching. In step 7, a pad 70, a color filter 82, and a micro-lens 84 are formed. Accordingly, the manufacture of the image sensor using a back-illuminated photodiode and having high sensitivity is completed.

Figure 5:
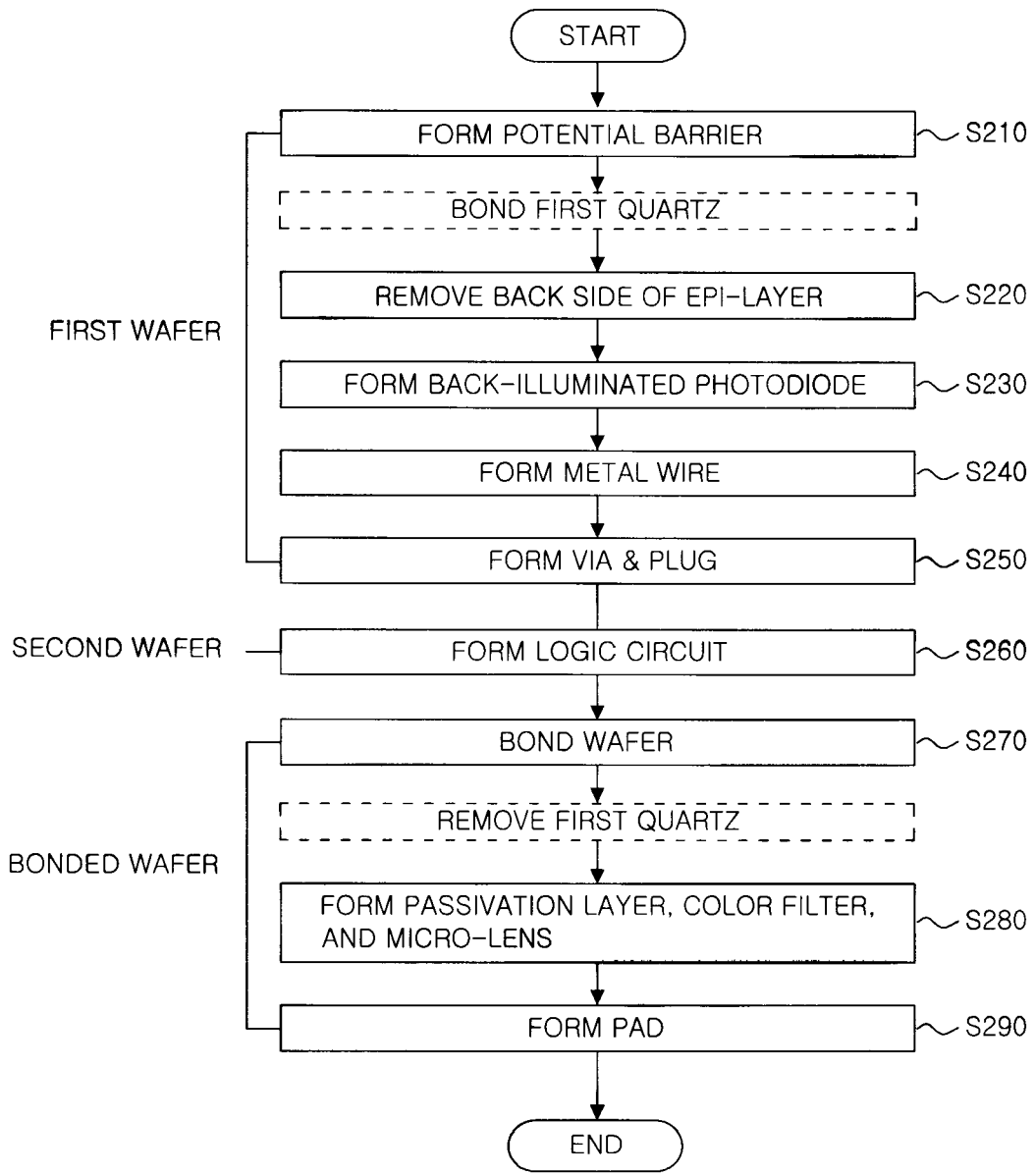
FIG. 5 is a flowchart of a method of manufacturing an image sensor using a back-illuminated photodiode according to another embodiment of the present invention.

FIG. 5 is a flowchart of a method of manufacturing an image sensor using a back-illuminated photodiode according to another embodiment of the present invention. The method includes the steps of: forming a potential barrier (step 210); removing a back side (step S220); forming a back-illuminated photodiode (step S230); forming a metal wire (step S240); forming a via & plug (step S250); forming a logic circuit (step S260); bonding a wafer (step S270); forming a color filter (step S280); and forming a pad (step S290).

In step S210, epi-layers are formed on first and second wafers by doping impurities of opposite types. A potential barrier is formed on a surface of the epi-layer of the first wafer.

As previously described with reference to FIG. 3, in FIG. 5, the potential barrier may also be formed by using at least one method selected from a group consisting of ion implantation, epi-growth, and BSG deposition. In order to stabilize the surface of the epi-layer on which the potential barrier is formed, heat treatment may be performed after the potential barrier of the first wafer is formed.

In step S220, a back side of the first wafer is removed except for the epi-layer.

In step S230, a back-illuminated photodiode is formed on the epi-layer surface exposed when the back side of the first wafer is removed in step S220.

In step S240, an IMD layer is formed on the back-illuminated photodiode, and a metal wire is formed inside the IMD layer.

In step S250, a via is formed to be connected to the metal wire, and the via is formed through the epi-layer from the surface of the potential barrier. A plug is filled in the via.

In step S260, an IMD layer is formed on the epi-layer of the second wafer, and a logic circuit including a metal wire is formed inside the IMD layer.

In step S270, the metal wired formed on the first wafer is connected to the metal wire of the logic circuit formed on the second wafer by metal bonding.

In step S280, a passivation layer, a color filter, and a micro-lens are formed on a surface of the potential barrier.

In step S290, a pad is formed on a surface of the via filled with the plug of the first wafer.

As previously described with reference to FIG. 3, in FIG. 5, in order to ensure a thickness sufficient to perform a subsequent process, a first quartz may be bonded to the surface of the epi-layer before or after the back side is removed in step S220. In the case of boding the first quartz, the first quartz may be removed prior to step S280.

Figure 6:
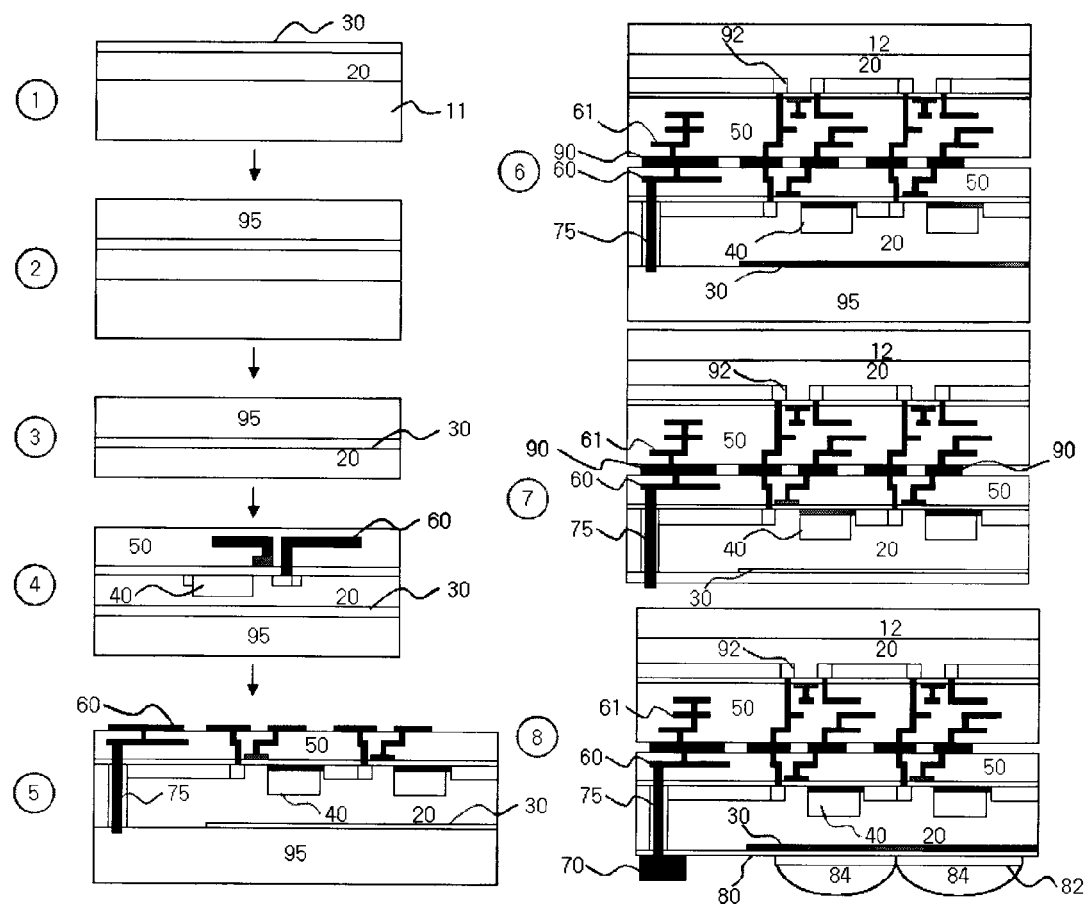
FIG. 6 illustrates cross-sectional views for explaining major processes of FIG. 5.

FIG. 6 illustrates cross-sectional views for explaining major processes of FIG. 5. A manufacturing process of the image sensor of FIG. 2 will now be described with reference to FIG. 6.

Steps 1 to 3 are the same as steps 1 to 3 of FIG. 4. In step 4, a photodiode and a control transistor are individually formed by using a typical image sensor manufacturing process. In step 5, a via & plug 75 is formed to pass through the epi-layer 20, and thus a metal bonding pad is electrically wired to a logic circuit formed on a separate second wafer 12.

After the first wafer 11 on which the photodiode is formed is electrically connected to the separate second wafer 12 on which the logic circuit is formed in step 6 by the use of a metal bonding pad, in step 7, a first quartz 95 formed on a substrate where the photodiode is formed is etched. In step 8, a pad 70, a color filter 82, and a micro-lens 84 are formed. Accordingly, the manufacture of an image sensor using a back-illuminated photodiode and having high sensitivity and high density is completed.

In the present invention, light can be absorbed through a bottom side of the photodiode rather than a top side of the photodiode. Thus, a step coverage is negligible from the photodiode to the color filter, thereby increasing efficiency of the photodiode even when a transmission depth is small. In addition, since light does not affect another photodiode after passing through respective color filters, color crosstalk can be avoided.

Furthermore, since a potential barrier is formed by doping impurities with high concentration on a surface of the epi-layer before the image sensor is manufactured in a conventional method in a state that no pattern is formed on a semiconductor substrate, heat treatment can be easily performed while restricting temperature, which has been an obstacle in the conventional method. Thus, a surface defect can be easily removed, and thus noise caused by a defected surface can be significantly restricted.

In a method of manufacturing an image sensor using a back-illuminated photodiode according to the present invention, a back side of a silicon substrate can be stability treated. Therefore, a noise problem of a back-illuminated photodiode can be prevented.

In addition, since light is absorbed through a bottom side of the back-illuminated photodiode, sensitivity is significantly improved, and crosstalk can be restricted.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An image sensor using a back-illuminated photodiode, comprising:
   epi-layers formed on first and second wafers each having a specific type by doping impurities with low concentration;
   a potential barrier formed on a surface of the epi-layer of the first wafer;
   a back-illuminated photodiode formed on the epi-layer which is formed on a back side of the first wafer;
   the second wafer on which a logic circuit is formed;

a metal bonding portion by which a metal wire connected to the back-illuminated photodiode formed on the first wafer is electrically connected to a metal wire connected to the logic circuit formed on the second wafer;

a pad formed on the potential barrier of the first wafer and electrically connected to an external circuit of the image sensor; and a via formed through the epi-layer and a plug which fills the via so that the pad is electrically connected to the logic circuit of the second wafer.

2. The image sensor of claim 1, further comprising:
a passivation layer formed on the potential barrier;
a color filter formed on the passivation layer; and
a micro-lens formed on the color filter.

3. The image sensor of claim 1, wherein the potential barrier is doped with impurities having the same type as the epi-layer and having relatively higher concentration than the epi-layer.

4. A method of manufacturing an image sensor, comprising the steps of:
   (a) forming epi-layers with low concentration on first and second wafers each having a specific type, and forming a potential barrier on a surface of the epi-layer of the first wafer;
   (b) removing a back side of the first wafer except for the epi-layer;
   (c) forming a back-illuminated photodiode on the surface of the epi-layer exposed in (b);
   (d) forming an inter-metal dielectric (IMD) layer on the back-illuminated photodiode, and forming a metal wire inside the IMD layer;
   (e) forming a via connected to the metal wire through the epi-layer from a surface of the potential barrier, and filling a plug into the via;
   (f) forming an IMD layer on the epi-layer formed on the second wafer, and forming a logic circuit including a metal wire inside the IMD layer;
   (g) connecting a metal wire of the first wafer to a metal wire of the logic circuit of the second wafer by using metal bonding;
   (h) forming a passivation layer, a color filter, and a micro-lens on a surface of the potential barrier; and
   (i) forming a pad on a surface of the via filled with the plug of the first wafer.

5. The method of claim 4, further comprising:
boning a first quartz to the surface of the epi-layer before or after (b); and
removing the first quartz before (h).

6. The method of claim 4, wherein the potential barrier is formed by using at least one method selected from a group consisting of ion implantation, epi-growth, and boro silicate glass (BSG) deposition.

7. The method of claim 4, wherein, in (a), after the potential barrier is formed on the first wafer, the surface of the epi-layer on which the potential barrier is formed is stabilized by heat treatment.

* * * * *